US00RE50326E

(19) United States
(12) Reissued Patent
Fourie et al.

(10) Patent Number: US RE50,326 E
(45) Date of Reissued Patent: Mar. 4, 2025

(54) MONITORING SYSTEM FOR A DISTRIBUTED ANTENNA SYSTEM

(71) Applicant: Gugli Corporation, Sheridan, WY (US)

(72) Inventors: Andries Petrus Cronje Fourie, Parkview (ZA); Derek Colin Nitch, Witkoppen (ZA)

(73) Assignee: Gugli Corporation, Sheridan, WY (US)

(21) Appl. No.: 17/946,949

(22) Filed: Sep. 16, 2022

Related U.S. Patent Documents

Reissue of:
(64) Patent No.: 9,900,114
Issued: Feb. 20, 2018
Appl. No.: 15/504,977
PCT Filed: Aug. 21, 2015
PCT No.: PCT/IB2015/056343
§ 371 (c)(1),
(2) Date: Feb. 17, 2017
PCT Pub. No.: WO2016/027256
PCT Pub. Date: Feb. 25, 2016

U.S. Applications:
(63) Continuation of application No. 16/796,178, filed on Jul. 10, 2020, now Pat. No. Re. 49,217, which is an application for the reissue of Pat. No. 9,900,114.

(30) Foreign Application Priority Data

Aug. 21, 2014 (ZA) ..... 2014/06162

(51) Int. Cl.
*H04B 17/00* (2015.01)
*G01R 29/08* (2006.01)
(Continued)

(52) U.S. Cl.
CPC ..... *H04B 17/16* (2015.01); *H04B 17/17* (2015.01); *G01R 29/0878* (2013.01);
(Continued)

(58) Field of Classification Search
CPC ..... H04B 17/16; H04B 17/17; H04B 17/40; H04W 24/08; H04W 88/085; G01R 29/0878; G01R 29/291
See application file for complete search history.

(56) References Cited

U.S. PATENT DOCUMENTS 5,640,151 A 6/1997 Reis
6,114,955 A 9/2000 Brunius et al.
(Continued)

FOREIGN PATENT DOCUMENTS

CN 102232310 A 11/2011
EP 2 765 721 8/2014
(Continued)

OTHER PUBLICATIONS

U.S. Appl. No. 16/287,880, filed Apr. 18, 2019, Leaf.
(Continued)

*Primary Examiner* — Ovidio Escalante
(74) *Attorney, Agent, or Firm* — Knobbe, Martens, Olson & Bear LLP

(57) ABSTRACT

A monitoring system 22 for a distributed antenna system (DAS) 10 is provided. The DAS comprises central transmitter 12 which is connected by a signal transmission network 14 to a plurality of distributed antenna devices (DAD) 16.1 to 16.n. The network comprises physical branches. Each of the DAD's is connected to a respective sub-branch 14.11 and comprises at least one antenna 18. The antenna is associated with a frequency band having a center frequency $f_c$ and an associated wavelength [Ac] $\lambda c$. The monitoring system comprises a central monitoring unit (CMU) 24 which is coupled to the network 14. A monitoring device 28.1 is associated with at least one of the DAD's and permanently mounted a distance $d<2\lambda_c$ away from the antenna of the DAD. The monitoring device comprises a controller 30, a transceiver 32 and an antenna 34. The
(Continued)

controller being configured, upon being polled by the CMU 24 with a monitoring signal via the network and the distributed antenna device, to cause the transceiver 32 to respond by transmitting a response signal to the CMU 24 via the distributed antenna device 16.1 and the network 14.

22 Claims, 4 Drawing Sheets

(51) Int. Cl.

| | |
|---|---|
| ***G01R 29/10*** | (2006.01) |
| ***H04B 17/16*** | (2015.01) |
| ***H04B 17/17*** | (2015.01) |
| ***H04B 17/40*** | (2015.01) |
| ***H04W 24/08*** | (2009.01) |
| ***H04W 24/10*** | (2009.01) |
| ***H04W 88/08*** | (2009.01) |

(52) U.S. Cl.
CPC ..... *G01R 29/10* (2013.01); *H04B 17/40* (2015.01); *H04W 24/08* (2013.01); *H04W 24/10* (2013.01); *H04W 88/085* (2013.01)

(56) References Cited

U.S. PATENT DOCUMENTS

| | | | | |
|---|---|---|---|---|
| 6,222,503 | B1 | 4/2001 | Gietema | |
| 6,369,766 | B1 * | 4/2002 | Strickland | H01Q 1/007 343/773 |
| 6,625,428 | B1 | 9/2003 | Finnell et al. | |
| 7,224,170 | B2 | 5/2007 | Graham et al. | |
| 7,268,564 | B2 * | 9/2007 | Ozaki | G01R 29/857 324/632 |
| 7,656,858 | B2 | 2/2010 | Campero | |
| 8,070,065 | B2 * | 12/2011 | Overhultz | G06K 7/10336 235/385 |
| 8,254,848 | B1 * | 8/2012 | Elliott | H04B 7/022 370/242 |
| 8,346,091 | B2 * | 1/2013 | Kummetz | H04W 88/085 370/276 |
| 8,744,390 | B2 | 6/2014 | Stratford | |
| 8,831,592 | B2 | 9/2014 | Elliot et al. | |
| 8,831,593 | B2 | 9/2014 | Melester et al. | |
| 8,843,174 | B2 | 9/2014 | Abouzid et al. | |
| 9,093,755 | B2 * | 7/2015 | Faxvog | H01Q 13/203 |
| 9,344,174 | B2 | 5/2016 | Ngai et al. | |
| 9,681,396 | B2 | 6/2017 | Williamson | |
| 9,894,623 | B2 | 2/2018 | Dussmann et al. | |
| 10,291,336 | B1 | 5/2019 | Leaf | |
| 10,594,412 | B2 | 1/2020 | Leaf | |
| 10,979,155 | B2 * | 4/2021 | Leaf | H01Q 21/28 |
| 2005/0107080 | A1 | 5/2005 | Hasegawa | |
| 2005/0206569 | A1 * | 9/2005 | Arndt | H01Q 1/1214 343/700 MS |
| 2006/0033640 | A1 | 2/2006 | Minor | |
| 2006/0066443 | A1 | 3/2006 | Hall | |
| 2006/0145884 | A1 | 7/2006 | Graham | |
| 2006/0197538 | A1 | 9/2006 | Leinonen | |
| 2007/0099667 | A1 * | 5/2007 | Graham | H01Q 13/203 455/562.1 |
| 2008/0186233 | A1 * | 8/2008 | McCoy | G06Q 10/087 342/444 |
| 2009/0168677 | A1 | 7/2009 | Kang et al. | |
| 2010/0141483 | A1 | 6/2010 | Thacher et al. | |
| 2011/0092181 | A1 * | 4/2011 | Jackson | G01R 29/0814 455/341 |
| 2011/0111700 | A1 * | 5/2011 | Hackett | H04W 72/23 455/41.2 |
| 2011/0116393 | A1 * | 5/2011 | Hong | H04W 72/082 370/252 |
| 2011/0193566 | A1 * | 8/2011 | Nyshadham | G01R 29/0878 324/637 |
| 2011/0307548 | A1 | 12/2011 | Fisk et al. | |
| 2012/0033559 | A1 * | 2/2012 | Kim | H04B 1/54 370/241 |
| 2012/0243846 | A1 * | 9/2012 | Jackson | H04N 5/77 386/223 |
| 2012/0289178 | A1 | 11/2012 | Matsumura et al. | |
| 2012/0322501 | A1 * | 12/2012 | Abouzid | G01S 5/02524 235/492 |
| 2013/0150065 | A1 * | 6/2013 | Elliott | H04W 24/06 455/422.1 |
| 2013/0288692 | A1 | 10/2013 | Dupray | |
| 2014/0024402 | A1 | 1/2014 | Singh | |
| 2014/0140225 | A1 | 5/2014 | Wala | |
| 2014/0203977 | A1 * | 7/2014 | Gao | H04B 17/10 343/703 |
| 2014/0241301 | A1 | 8/2014 | Nakashima | |
| 2014/0269859 | A1 | 9/2014 | Van Hansen | |
| 2016/0033635 | A1 | 2/2016 | Hansen | |
| 2016/0095068 | A1 | 3/2016 | Henia | |
| 2017/0019144 | A1 * | 1/2017 | Malach | H04B 1/48 |
| 2017/0262670 | A1 | 9/2017 | Marchant | |
| 2017/0272179 | A1 | 9/2017 | Antkowiak | |
| 2017/0373768 | A1 | 12/2017 | Antkowiak et al. | |
| 2018/0027430 | A1 | 1/2018 | Pasulka et al. | |
| 2018/0170127 | A1 | 6/2018 | DeBates | |
| 2020/0186233 | A1 | 6/2020 | Park | |
| 2021/0367688 | A1 | 11/2021 | Leaf | |

FOREIGN PATENT DOCUMENTS

| | | | |
|---|---|---|---|
| EP | 2765721 A1 * | 8/2014 | H04B 17/0085 |
| WO | WO 2011-091859 | 8/2011 | |
| WO | WO 2013/009283 | 1/2013 | |
| WO | WO 2016/009327 | 1/2016 | |
| WO | WO 2017/197341 | 11/2017 | |

OTHER PUBLICATIONS

U.S. Appl. No. 16/816,724, filed Mar. 12, 2020, Leaf.
U.S. Appl. No. 16/796,178 (issuing as Re. 492,217), filed Feb. 20, 2020, Fourie.
U.S. Appl. No. 17/822,670, filed Aug. 26, 2022, Leaf.
NFPA 1221 Standard for the Installation, Maintenance, and Use of Emergency Services and Communication Systems, 2019 edition (2018).
Comba Telecom Releases Innovative Antenna Monitoring System for Public Safety In-Building Communications Systems (Mar. 4, 2019), available at https://www.combausa.com/en/press-releases/comba-telecom-releases-innovative-antenna-monitoring-system-for-public-safety-in-building-communications-systems.

* cited by examiner

MONITORING SYSTEM FOR A DISTRIBUTED ANTENNA SYSTEM

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

REFERENCE TO RELATED APPLICATIONS

This [application] *is an application for reissue of U.S. Pat. No. 9,900,114, issued Feb. 20, 2018, which issued from U.S. patent application Ser. No. 15/504,977, filed Feb. 17, 2017, which* is the U.S. National Phase of International Application PCT/IB2015/056343, filed Aug. 21, 2015, and claims priority to ZA Application No. 2014/06162, filed Aug. 21, 2014. *This application is a continuation of U.S. patent application Ser. No. 16/796,178, filed Feb. 20, 2020, which is an application for reissue of U.S. Pat. No. 9,900, 114, now RE 49,217.* Each of the priority applications is hereby incorporated by reference in its entirety.

INTRODUCTION AND BACKGROUND

This invention relates to distributed antenna systems, more particularly to a monitoring system and method for a distributed antenna system.

Distributed antenna systems (DAS) are known in the art and are typically employed to provide in-building coverage, but more recently are also used to provide area coverage outside of buildings. DAS may be passive or active. A passive DAS comprises a central or base transceiver station linked by a radio frequency (RF) signal transmission network comprising RF transmission lines (coaxial or other) to a plurality of distributed antenna devices (DAD) distributed through the area to be covered with power diverted according to some propagation plan to each DAD, such that adequate coverage is ensured throughout the building or area for which the DAS is installed.

An active DAS is similar, but in these systems the RF signals are modulated up to convert them to optical fibre frequencies. Optical fibers are then used to distribute the resulting signals to a point close to the DAD. An optic-to-radio converter unit is used to convert the signals back to their original RF band. The optic-to-radio convertor is coupled using RF transmission lines which provide the last mile to one or more DAD's, which provide coverage to sub-areas of the area covered by the DAS. Other active DAS systems may involve bi-directional amplifiers and/or frequency convertors in between the central transceiver and the DADs.

A DAS may employ between a few to many hundreds of DAD's to provide coverage throughout the area. These DAD's or the signal transmission network and intermediate devices used to link these DAD's to the base transceiver station may fail or degrade over time. Currently such faults are difficult to detect or monitor. One known solution is to use regular "walk tests" to measure network coverage throughout the coverage area, but these are time consuming, costly and faults are detected well after they had occurred.

In U.S. Pat. No. 8,254,848 there is disclosed another solution which comprises a plurality of statically deployed monitoring devices. The monitoring devices are remote from the DAD's being monitored and test results are reported to a central and remote collection component directly or indirectly through other monitoring devices having an Ethernet connection. This solution may be unnecessarily costly. Furthermore, due to the separation between DAD's and the monitoring devices, individual DAD's and branches in the network may be difficult to pinpoint. Hence, the solution may not be suitable for at least some applications.

OBJECT OF THE INVENTION

Accordingly it is an object of the present invention to provide a monitoring system and method with which the applicant believes the aforementioned disadvantages may at least be alleviated or which may provide a useful alternative for the known systems and methods.

SUMMARY OF THE INVENTION

According to the invention there is provided a monitoring system for a distributed antenna system comprising at least a central transmitter and a plurality of distributed antenna devices connected to the transmitter via a respective physical branch of a signal transmission network comprising a plurality of branches, each of the distributed antenna devices comprising at least one antenna which is associated with a frequency band having a centre frequency $f_c$ and a corresponding wavelength $\lambda_c$, the monitoring system comprising:

a central monitoring unit which is coupled to the network;

at least one monitoring device associated with at least one of said distributed antenna devices and permanently mounted a distance d away from the at least one antenna of the distributed antenna device, the distance d being less than 2 times $\lambda_c$ ($2\lambda_c$);

the at least one monitoring device comprising a local controller, a transceiver and an antenna;

the local controller being configured, upon being polled by the central monitoring unit via the network and the distributed antenna device, to cause the transceiver to respond to the poll by transmitting a response signal to the central monitoring unit via the distributed antenna device and the network.

The distance d may be less than $\lambda_c$, preferably less than $\lambda_c/2$ and even less than $\lambda_c/4$.

The monitoring device may comprise a local power supply, for example in the form of a battery. Alternatively or in addition, the monitoring device may comprise an energy harvesting circuit for collecting energy from the DAD through the antenna of the monitoring device. The energy may be used to recharge the battery.

Each monitoring device may be associated with a unique address which may be stored in a memory arrangement of the monitoring device.

Each monitoring device may also comprise indicator means for providing a human perceivable indication relating to a monitored status of the associated DAD and/or the branch of the network connected thereto.

The monitoring device may be mounted in or on the DAD. It may for example be retrofitted on a radome of the DAD. In such a case, the monitoring device may be housed in a housing or encapsulated in a flexible sleeve or envelope, which may be adhered to the radome.

The central monitoring unit may comprise means for measuring the strength of the response signal received from the at least one monitoring device and a database for storing data relating to the unique addresses of each monitoring device, data relating to a monitored status of each DAD and optionally data relating to the position of the DAD associated with the monitoring device.

The central monitoring unit may be coupled to the network by a suitable coupler to inject a weak monitoring message or signal or tone into the network. The message or signal or tone may be in-band or out of specific DAS communication bands, but within the overall band which the DAS system is designed to operate over.

The monitoring message may be addressed to a targeted monitoring device by using the unique address of the monitoring device.

The invention also includes within its scope a DAS comprising a monitoring system as herein defined and/or described.

Still further included within the scope of the present invention are a central monitoring unit as herein defined and/or described and a monitoring device as herein defined and/or described.

The invention also includes within its scope a method of monitoring performance of a distributed antenna system comprising at least a central transmitter and a plurality of distributed antenna devices connected to the transmitter via a respective physical branch of a signal transmission network comprising a plurality of branches, each of the distributed antenna devices comprising at least one antenna which is associated with a frequency band having a centre frequency $f_c$ and a corresponding wavelength $\lambda_c$, the method comprising:

for at least some of the distributed antenna devices, providing a respective monitoring device at a distance $d<2\lambda_c$ from the at least one antenna;

transmitting from a central monitoring unit, along the network and via the distributed antenna device to at least one targeted monitoring device a monitoring signal;

at the at least one targeted monitoring device generating a response signal and transmitting the response signal to the central monitoring unit via the distributed antenna device and the network; and utilizing at least one of the monitoring signal and the response signal to monitor performance of at least part of the distributed antenna system.

The monitoring signal may addressed to the at least one targeted monitoring device by utilizing a respective unique address of the at least one targeted monitoring device.

The strength of the monitoring signal may be measured at the at least one targeted monitoring device.

Data relating to the measured strength may then be sent from the at least one targeted monitoring device via the associated distributed antenna device and the network to the central monitoring unit and the data may be identified at the central monitoring station by the respective unique address.

The strength of the response signal may be measured at the central monitoring unit.

In some embodiments, the strength of the monitoring signal may be measured at the at least one targeted monitoring device and the strength of the response signal may be measured at the central monitoring unit and the results of the measurements may be utilized to monitor the status of asymmetrical up and down paths between the central monitoring unit and the at least one targeted monitoring unit.

The method may include the step of utilizing switches which are distributed in the network selectively to attenuate or divert power propagating to at least some of the distributed antenna devices, thereby selectively to switch the at least some of the distributed devices out of the distributed antenna system.

The switches may be controlled by command signals from at least the central monitoring unit.

The monitoring signal, the response signal and the command signals may be at a suitable signal level to ensure communication and sensing between central monitoring unit, but below the level of a main signal transmitted by the central transmitter and below regulatory or operator requirements in terms of signal radiated from DADs as to meet regulatory requirements or DAS user requirements.

The monitoring signal, response signal and command signals may be transmitted according to a standard protocol and at a level of −30 dB relative to the main signal.

The monitoring signal, response signal and command signals may be transmitted out of band relative to the main signal.

The method [as claimed in the] may include the step of indicating the monitored status at the monitoring device [and or] *and/or* transmitting status information to other locations or a database to be accessed by various interested parties.

The monitored status may be determined by the monitoring device and the monitoring device may then indicate the status. In other embodiments the monitored status may be determined at the central monitoring unit and then the status may be indicated in response to a command sent from the central monitoring unit to the monitoring device.

BRIEF DESCRIPTION OF THE ACCOMPANYING DIAGRAMS

The invention will now further be described, by way of example only, with reference to the accompanying diagrams wherein.

DESCRIPTION OF A PREFERRED EMBODIMENT OF THE INVENTION

Figure 1:
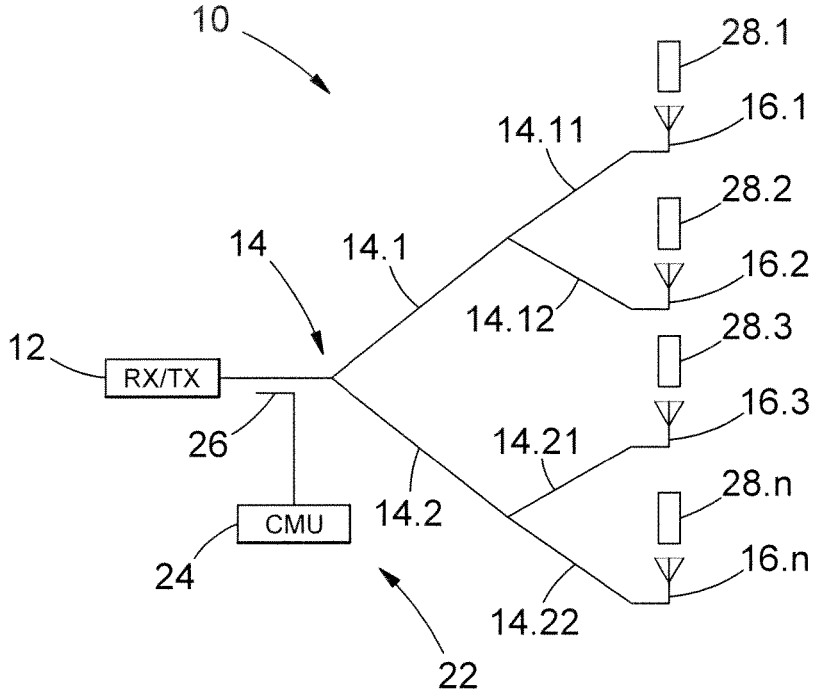
FIG. 1 is a diagram of an example embodiment of a simple distributed antenna system (DAS) and a monitoring system for the DAS.

An example embodiment of a distributed antenna system (DAS) is generally designated by the reference numeral 10 in FIG. 1. The DAS comprises at least a central transmitter 12 which is connected by a signal transmission network 14 to a plurality of distributed antenna devices (DAD) 16.1 to 16.n to transmit a main signal propagating in a downward direction from the central transmitter 12. The network comprises physical branches, such as branches 14.1 and 14.2. Each of the DAD's 16.1 to 16.n is connected to a respective sub-branch part or last mile 14.11, 14.12, 14.21 and 14.22 of branches 14.1 and 14.2. The network 14 may be passive and comprise cables with splitters or may be active as defined in the introduction of this specification. Hence, the network may comprise one or more of frequency converting devices, radio-to-optic and reverse devices, point-to-point wireless components and bidirectional amplifiers.

Figure 2:
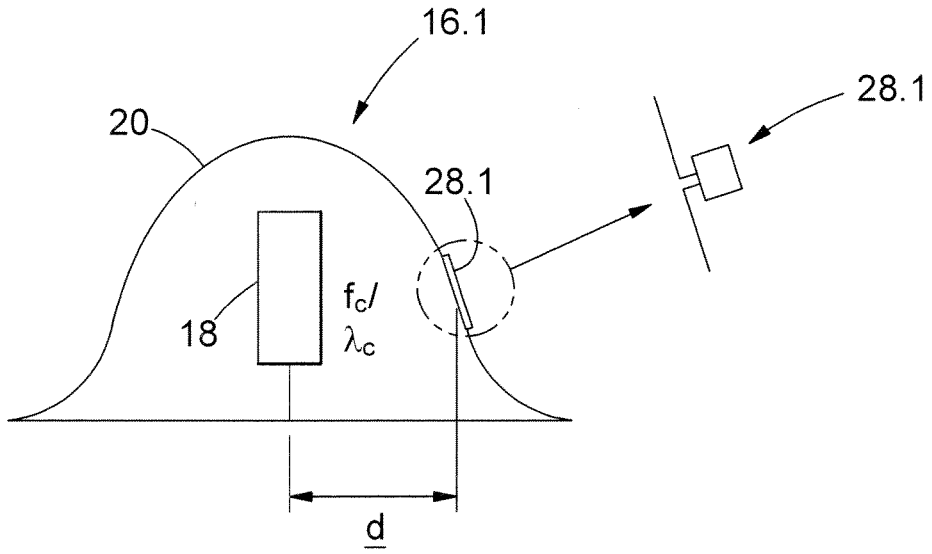
FIG. 2 is a diagrammatic representation of an example embodiment of a distributed antenna device (DAD) forming part of the DAS in FIG. 1 and an associated monitoring device of the monitoring system.

An example embodiment of a DAD 16.1 is shown in FIG. 2. Each DAD comprises at least one antenna 18. The antenna is associated with a frequency band having a centre frequency $f_c$ and an associated wavelength $\lambda_c$. The DAD may optionally comprise a radome 20.

Figure 3:
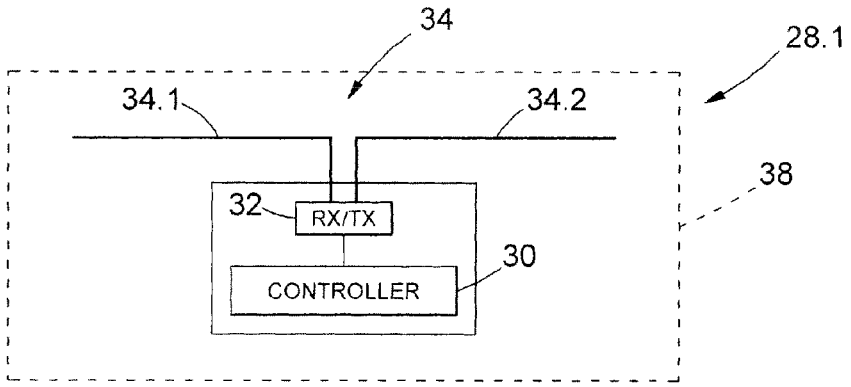
FIG. 3 is a basic block diagram of an example embodiment of the monitoring device.

An example embodiment of a monitoring system is generally designated by the reference numeral 22 in FIG. 1. The monitoring system comprises a central monitoring unit CMU 24 which is coupled to the network 14. At least one monitoring device 28.1 to 28.n is associated with at least one of said distributed antenna devices 16.1 to 16.n and permanently mounted a distance d (see FIG. 2) away from the antenna of the associated distributed antenna device. The distance d is less than $2\lambda_c$, preferably less than $\lambda_c$, more preferably less than $\lambda_c/2$ and even less than $\lambda_c/4$. Referring to FIG. 3, the monitoring device comprises a local controller 30, a transceiver 32 and an antenna 34. The local controller being configured, upon being polled by the CMU 24 with a monitoring signal in a downward direction and along a downward path via the network 14 and the distributed antenna device 16.1, to cause the transceiver 32 to respond to the monitoring signal by transmitting a response signal in an upward direction and along an upward path to the CMU 24 via the distributed antenna device 16.1 and the network 14. In some embodiments, especially in active networks, the upward and downward paths may not be the same and may hence be asymmetrical.

The CMU 24 may comprise a transceiver which may be connected to the network 14 by coupler 26 in a region of the network 14 towards the central transmitter 12 and before or upstream of a first branch 14.1, 14.2.

Referring to FIG. 3 and as stated above, the monitoring device 28.1 comprises the local controller 30 which is connected to the transceiver 32 and which is connected to poles 34.1 and 34.2 of a broadband dipole antenna 34. Each monitoring device may be associated with a unique address which is stored in a memory arrangement of the controller. The address may be used by the CMU 24 to poll or interrogate individual monitoring devices. The address may also be used to identify responses received by the CMU 24 from monitoring devices by virtue of the monitoring device appending its unique address to a response signal sent back to the CMU 24.

The CMU 24 may use any suitable communication standard to communicate with or poll via the network 14 any one or more of the monitoring devices 28.1 to 28.n. As an example, the ZigBee communication protocol and devices operating in the 2.4 GHz licensed frequency bands may be used to effect communication and addressing between the CMU 24 and other devices of the monitoring system and the same signals may additionally be used to monitor RF path and DAD operation. The ZigBee units may additionally be equipped with the ability to generate test signals at other frequencies used in the DAS system, if required. Other protocols operating at other frequencies may serve a similar purpose, such as Bluetooth, Wifi and/or similar communication protocols.

Figure 4:
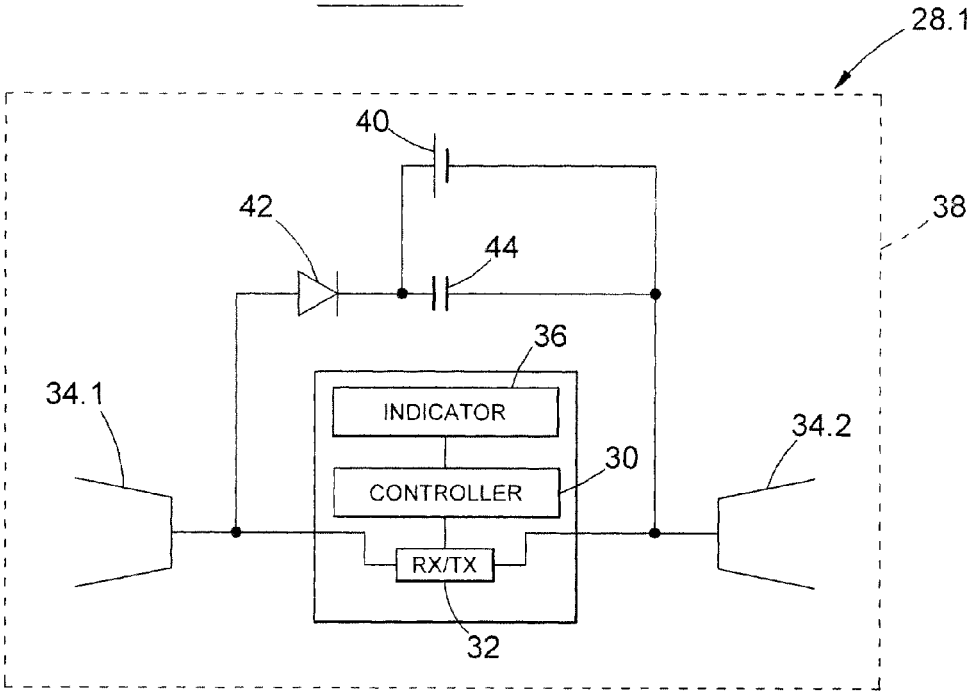
FIG. 4 is a basic block diagram of another example embodiment of the monitoring device with an example embodiment of an energy harvesting circuit for powering the monitoring device.

As shown in the example embodiment in FIG. 4, the monitoring device 28.1 may comprise an indicator arrangement 36, for example in the form of one or more LED's which may be used to indicate a status of the DAD 16.1, as explained below. Each monitoring device may comprise means (not shown) for measuring the strength of a received monitoring signal. Furthermore, the monitoring device may comprise a power supply comprising a battery 40, alternatively a battery plus an energy harvesting circuit, which may for example comprise diode 42 and capacitor 44. In some embodiments, the monitoring device 28.1 may be encapsulated in any suitable encapsulation 38, for example a flexible sleeve or envelope, which may be adhered to a surface of the radome 20. This may be particularly advantageous when retrofitting monitoring devices on existing DAD's comprising radomes.

The CMU 24 may comprise or be connected to a database (not shown) for storing said unique addresses, monitored status of each DAD as well as data relating to the position of the associated DAD. Hence, the monitoring devices may comprise complementary circuitry to respond via the network 14 to the CMU 24. The CMU 24 may also comprise means for measuring the strength of a response signal received from any of the monitoring devices and processing means for processing such measurements.

In order not to interfere with the DAS, the CMU 24 is coupled to the main branch of the network 14 via coupler 26 to transmit via the network weak monitoring signals (at say −10 dB of the main signal, preferably −30 dB) and/or out of band monitoring signals which are received and processed by the monitoring devices 28.1 to 28.2 as will be described below.

Figure 5:
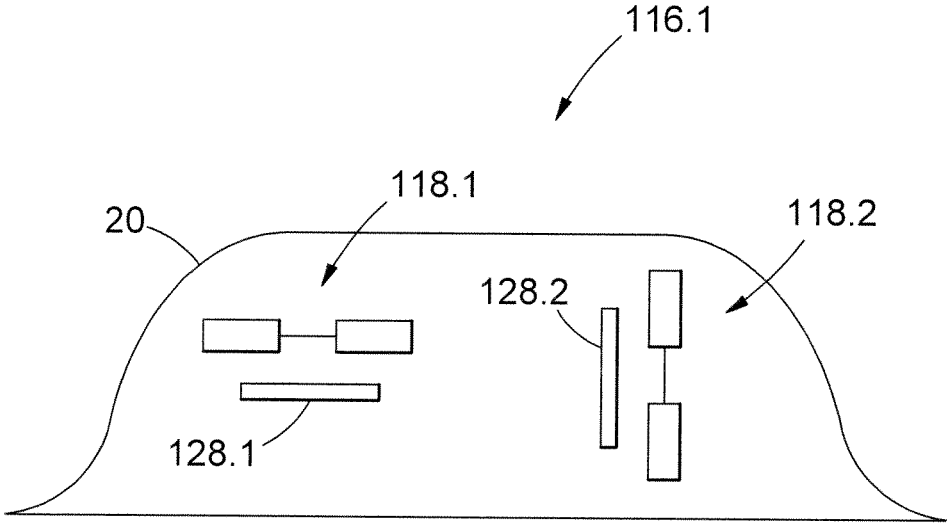
FIG. 5 is a diagrammatic representation of example embodiments of monitoring devices for a multiple-input and multiple-output (MIMO) DAD.

In FIG. 5, there is shown an example embodiment of a multiple-input and multiple-output (MIMO) DAD 116 comprising a first antenna 118.1 and a second antenna 118.2 which are orthogonally polarized. Associated monitoring devices 128.1 and 128.2 with corresponding antenna orientations are provided in close proximity d (as defined above) from the first and second antennas, to ensure that both can be monitored independently. If the number of monitoring devices is equal to the number of MIMO elements in a MIMO DAD and close enough to the respective associated elements, the monitoring system may be used to monitor status of specific MIMO antennas within a DAD.

The CMU 24 may be pre-programmed to poll each monitoring device 28.1 to 28.n on an intermittent, alternatively periodic basis. This is done by sending the monitoring signal with each monitoring device's address successively and waiting for the response signal from the monitoring devices. Upon receiving the response signal from a monitoring device, the strength of that response signal is measured, compared to a reference and/or previous values and stored and/or communicated to an external control centre. If no response is received from a monitoring device, after a predetermined number of polls, the monitoring device and/or DAD is tagged as defective. If a signal strength measurement on a response signal indicates degradation in or to the transmission path below a predetermined limit, then that monitoring device is instructed from the CMU 24 to update locally its status to "low level" and the indicator means 36 is caused to indicate that status. Further for example, failure of both devices 28.1 and 28.2 could be interpreted by the CMU 24 as likely failure of branch 14.1, rather than failure of DAD 16.1 and 16.2.

The monitoring device may be programmed to activate the local indicator 36 or may be configured in response to a command signal from the CMU 24 to display status, depending on where the measurement is done, at the monitoring device or at the CMU 24. Status indications may include: failure, power reduction below predetermined limit, working status, low battery etc.

Hence, the monitoring devices may use the polling or monitoring signal received via its associated DAD to measure the signal quality and report back by means of the response signal such signal quality to the CMU 24. Alternatively, the strength of the response signal as measured at the CMU 24 may be used to determine the path quality between the DAD and the CMU 24. Whether sensing is done at the CMU 24 or at the respective monitoring devices, the monitoring system 22 may be configured to sense both a) failure vs operational and b) relative signal level.

As explained in more detail below, additional components which operate on the same protocol as the CMU 24 and the monitoring devices 28.1 to 28.n may be inserted into the network 14, to adjust network configurations or parameters. Such components could be inserted in-line to switch off certain DAD's or branch lines leading to DAD's or to attenuate/increase signal levels to DAD's or sections of DAD's.

Tones may be inserted at different frequencies used by the DAS 10 by either monitoring devices 28.1 to 28.n or CMU 24, to enable in-band or band related and/or more accurate measurements on the system 10.

Monitoring devices 28.1 to 28.n could use wireless mesh or other communication to adjacent or closely located other monitoring devices to establish an alternative response or up path back to the CMU 24, in the event of failure of a line or branch to which they are connected.

Figure 6:
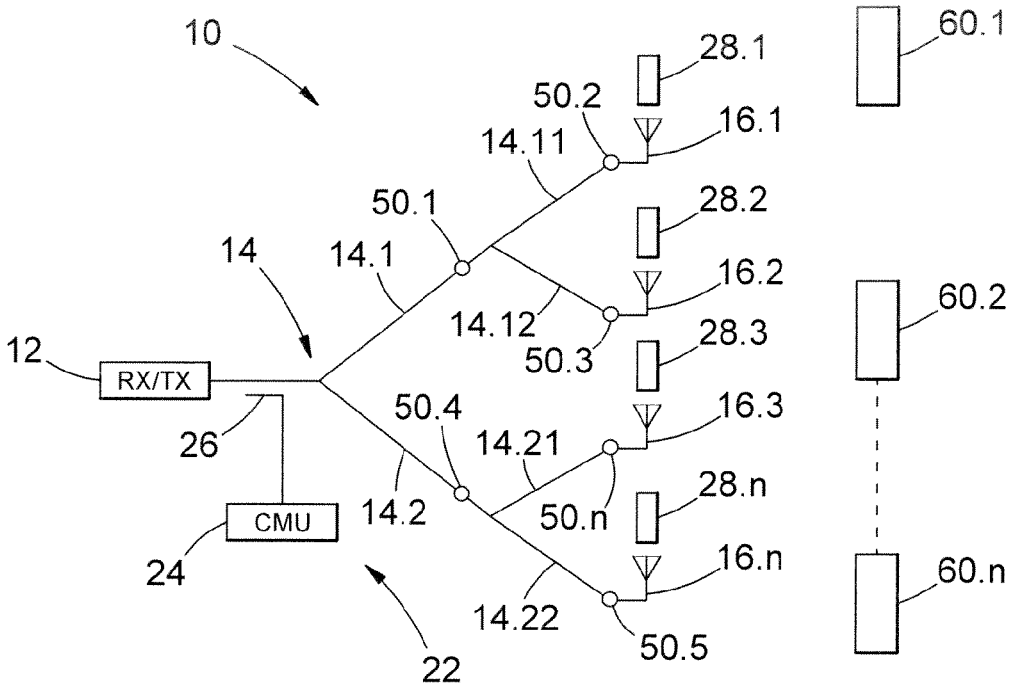
FIG. 6 is a diagrammatic representation of another example embodiment of a DAS and monitoring system comprising RF path diagnostic devices or switches and further signal monitoring devices which may be either fixed or roaming.

FIG. 6 is a figure similar to FIG. 1, but with RF path diagnostic devices or switches 50.1 to 50.n included in at least some of the branches of the network. The switches may be used selectively to switch a major part of signal power (for example reducing the through signal by 30 dB and diverting the major part to a suitable dummy load) as will be described below. Additionally, some further distributed signal monitoring units 60.1 to 60.n are included. These may be stationary or mobile.

Figure 7:
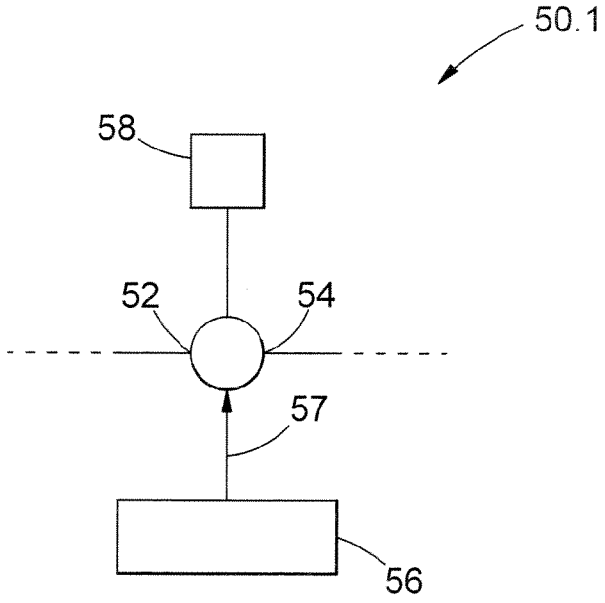
FIG. 7 is a block diagram of an example embodiment of an RF path diagnostic device or switch.

FIG. 7 illustrates an example embodiment of switch 50.1. The switch may have a first port 52 for a path part extending to CMU 24 and a second port 54 for a path part extending to at least one DAD, such as DAD's 16.1 and 16.2. The switch is connected to a controller 56 and to a dummy load 58. The controller 56 is in communication with the monitoring system 22 using the above communication protocol. Path 57 carries a control signal and optionally some suitable reduced power tap off from the main line signal, to allow communication to the monitoring system. Controller 56 is configured upon command from the monitoring system or automatically under program control, to either allow the DAS signal to flow between ports 52 and 54 or a major part thereof to flow to dummy load 58, with say only −30 dB of the original signal to pass from the first to the second port. The small signal still passed allows communication to happen between monitoring units 28.1 to 28.n and CMU unit 24 while effectively isolating specific DAD's or groups of DAD's, to identify problems such as passive intermodulation (PIM) or perform propagation tests from specific DAD's or groups of DAD's, while others are effectively non-operational.

Hence, the system may comprise path diagnostic devices or switches 50.1 to 50.n comprising respective controllers 56 operating on the same frequency and protocol as the monitoring devices and CMU 24. The controller 56 is operative (under program control or on command from the CMU 24) to cause the switch to switch between a first state wherein the switch allows the RF signal to continue unhindered and a second state wherein the switch causes part of the RF signal to be diverted to the dummy load 58, so that most power goes to the dummy load with less than −10 dB, but preferably −30 dB continuing along the branch to which it is connected. This switch can be addressed by either the CMU 24 or any monitoring device or any other transmission diagnostic device, since all operate on the same frequency and uses the same communication protocol. Hence, such switches may be used to selectively isolate parts of the DAS system or specific DADs for diagnostic purposes or to test the monitoring device operation.

Furthermore, the system may be configured to measure signal in both directions of the DAS path to a specific DAD. The signals along the "down path" (that is towards the DAD's) and the "up path" (that is towards the CMU) may not be symmetrical due to active components. Utilizing the signal sensing and transmitting capabilities of the monitoring devices and the CMU 24, the measurements could be done for "up" and "down" paths. Such measurements allow faults with specific units (up or down amplifiers for example) to be pinpointed by comparison of the signal measurements along both paths and associated with specific DAD's or group of DAD's.

Still furthermore, the monitoring system 22 may in addition to the monitoring devices 28.1 to 28.n and the path diagnostic devices 50.1 to 50.n comprise further distributed signal monitoring devices 60.1 to 60.n (shown in FIG. 6) and which may be similar to that of the prior art. However, the distributed signal monitoring devices 60.1 to 60.n may operate on the same communication protocol and frequency band as the monitor system 22. The signal monitoring devices 60.1 to 60.n may have the same functionality as the monitoring devices 28.1 to 28.n, but may have different form factors and/or antenna configurations and/or energy harvesting circuitry (such as photovoltaic convertors). These devices 60.1 to 60.n may be scattered or distributed through the DAS coverage area in permanent locations or alternatively temporarily located throughout the area to validate correct DAS system coverage after installation, or, may be moved around through the DAS coverage area after final installation to monitor signal and use DAD location either correlated in real time or by correlating mobile position which may be time related by mobile unit during walk-through or other mobile test of coverage. During such measurements, communication (polling) signals and unique identifiers associated with DAD's and further monitoring devices will be used in either up or down or both directional measurements to determine coverage.

Communication may happen between the CMU 24 via DAD's to signal monitoring devices 60.1 to 60.n directly or may also be relayed via monitoring devices 28.1 to 28.n. Monitoring may be performed using information from signal monitoring device 60.1 to 60.n operation in conjunction with information from monitoring device 28.1 to 28.n operation and optionally selective isolation using path diagnostic devices or switches 50.1 to 50.n, to get detailed information of coverage.

The invention claimed is:

[1. A monitoring system for a distributed antenna system comprising at least a central transmitter and a plurality of distributed antenna devices connected to the transmitter via a respective physical branch of a signal transmission network comprising a plurality of branches, each of the distributed antenna devices comprising at least one antenna which is associated with a frequency band having a centre frequency fc and a corresponding wavelength λc, the monitoring system comprising:

a central monitoring unit which is coupled to the network;

at least one monitoring device associated with at least one of said distributed antenna devices and permanently mounted a distance d away from the at least one antenna of the distributed antenna device, the distance d being less than 2 times λc (2λc);

the at least one monitoring device comprising a local controller, a transceiver and an antenna;

the local controller being configured, upon being polled by the central monitoring unit with a monitoring signal via the associated distributed antenna device and the respective branch of the network, to process the monitoring signal to measure the quality of the monitoring signal and to cause the transceiver to respond to the monitoring signal by transmitting a response signal comprising an indication of the measured quality to the central monitoring unit via the associated distributed antenna device and the network.]

[2. The monitoring system as claimed in claim 1 wherein d is less than λc/2.]

[3. The monitoring system as claimed in claim 1 wherein the at least one monitoring device comprises a local power supply comprising at least one of a battery and an energy harvesting circuit for collecting energy from the distributed antenna device through the antenna of the monitoring device.]

[4. The monitoring system as claimed in claim 1 wherein the at least one monitoring device is associated with a respective unique address which is stored in a memory arrangement of the monitoring device.]

[5. The monitoring system as claimed in claim 4 wherein the central monitoring unit comprises means for measuring the strength of the response signal received from the at least one monitoring device and a database for storing data relating to the unique addresses of the at least one monitoring device and at least one of data relating to the monitored status and data relating to a position of the associated distributed antenna device.]

[6. The monitoring system as claimed in claim 1 wherein the at least one monitoring device comprises an indicator arrangement for providing a human perceivable indication relating to a monitored status of at least one of the associated distributed antenna device and the branch connected thereto, based on the measured quality of the monitoring signal.]

[7. The monitoring system as claimed in claim 1 wherein the at least one monitoring device is mounted in or on the associated distributed antenna device.]

[8. The monitoring system as claimed in claim 7 wherein the at least one monitoring device is encapsulated in a housing which is mountable on an optional radome of the associated distributed antenna device.]

[9. The monitoring system as claimed in claim 1 wherein the central monitoring unit is coupled to the network by a coupler to inject the monitoring signal into the network.]

[10. The monitoring system as claimed in claim 1 wherein the monitoring signal and the response signal are at least one of a) at least 10 dB weaker than a main signal transmitted by the central transmitter and b) out of band relative to the main signal.]

[11. The monitoring system as claimed in claim 1 comprising at least one path diagnostic switching device which is connected in a branch of the network and configured to be switched between a first state wherein it passes along the branch input power received by the switch device and a second state wherein it attenuates or diverts away from the branch at least some of the input power received by the switch device.]

[12. A distributed antenna system comprising a monitoring system as claimed in claim 1.]

[13. A system as claimed in claim 1 wherein the quality of the monitoring signal is measured by measuring the strength of the monitoring signal and wherein the indication of the measured quality comprises data relating to the measured strength.]

[14. A method of monitoring performance of a distributed antenna system comprising at least a central transmitter and a plurality of distributed antenna devices connected to the transmitter via a respective physical branch of a signal transmission network comprising a plurality of branches, each of the distributed antenna devices comprising at least one antenna which is associated with a frequency band having a centre frequency fc and a corresponding wavelength λc, the method comprising:

for at least some of the distributed antenna devices, providing a respective associated monitoring device at a distance d<2λc from the at least one antenna;

transmitting from a central monitoring unit to at least one targeted monitoring device a monitoring signal via the associated distributed antenna device and the respective branch of the network;

at the at least one targeted monitoring device processing the monitoring signal to measure the quality of the monitoring signal and generating a response signal comprising an indication of the measured quality and transmitting the response signal to the central monitoring unit via the associated distributed antenna device and the network.]

[15. The method as claimed in claim 14 wherein the monitoring signal is addressed to the at least one targeted monitoring device by utilizing a respective unique address of the at least one targeted monitoring device.]

[16. The method as claimed in claim 14 wherein the monitoring signal is processed by measuring the strength of the monitoring signal at the at least one targeted monitoring device.]

[17. The method as claimed in claim 16 wherein data relating to the measured strength is sent from the at least one targeted monitoring device via the associated distributed antenna device and the network to the central monitoring unit and wherein the data is identified by the respective unique address.]

[18. The method as claimed in claim 17 wherein the strength of the response signal is measured at the central monitoring unit and wherein results of the measurements are utilized to monitor the status of asymmetrical up and down paths between the central monitoring unit and the at least one targeted monitoring unit.]

[19. The method as claimed in claim 14 wherein distributed switches in the network are utilized selectively to attenuate or divert power propagating to at least some of the distributed antenna devices, thereby to switch the at least some of the distributed devices out of the distributed antenna system and wherein the switches are controlled by command signals from at least the central monitoring unit.]

[20. The method as claimed in claim 19 wherein the monitoring signal, the response signal and the command signals are at a signal level to ensure communication and sensing between central monitoring unit, the monitoring devices and the switches devices, but below the level of a main signal transmitted by the central transmitter.]

*21. An antenna monitoring system comprising:*

*a first monitor device configured to be adhered to a radome of a first antenna connected to a wired signal transmission network, the first monitor device configured to transmit a first antenna monitor signal, the first antenna monitor signal including first monitor data associated with the first monitor device;*

*a second monitor device configured to be adhered to a radome of a second antenna connected to the wired signal transmission network, the second monitor device configured to transmit a second antenna monitor signal, the second antenna monitor signal including second monitor data associated with the second monitor device, the second monitor data being different from the first monitor data;*

*a coupler configured to be connected to the wired signal transmission network; and*

*a monitoring unit configured to be connected to the wired signal transmission network through the coupler, the monitoring unit further configured to receive the first antenna monitor signal, receive the second antenna monitor signal, generate a first antenna status indicating a status of the first antenna, and generate a second antenna status indicating a status of the second antenna;*

*wherein, within a predetermined time period, the first monitor device transmits the first antenna monitor signal, and within a same predetermined time period, the second monitor device transmits the second antenna monitor signal;*

*wherein, responsive to receiving the first antenna monitor signal, the monitoring unit generates the first antenna status indicating an operational status of the first antenna;*

*wherein, responsive to failing to receive the second antenna monitor signal, the monitoring unit generates the second antenna status indicating a defective status of the second antenna;*

*wherein the monitoring unit is configured to transmit a first signal to the first monitor device and transmit a second signal to the second monitor device;*

*wherein the coupler is configured to inject the first signal and the second signal into the wired signal transmission network;*

*wherein the first monitor device is configured to transmit the first antenna monitor signal responsive to receiving the first signal via the wired signal transmission network; and*

*wherein the second monitor device is configured to transmit the second antenna monitor signal responsive to receiving the second signal via the wired signal transmission network.*

*22. The antenna monitoring system of claim 21, wherein the first monitor data includes a first monitor device identifier identifying the first monitor device, and wherein the second monitor data includes a second monitor device identifier identifying the second monitor device.*

*23. The antenna monitoring system of claim 22, further comprising an antenna status database, wherein the monitoring unit stores a database entry representing the first antenna status in the antenna status database and stores a database entry representing the second antenna status in the antenna status database.*

*24. The antenna monitoring system of claim 23, wherein:*

*the first monitor device periodically and once within each of successive predetermined periods of time transmits the first antenna monitor signal;*

*the second monitor device periodically and once within each of successive predetermined periods of time transmits the second antenna monitor signal;*

*responsive to receiving the first antenna monitor signal, the monitoring unit generates the first antenna status indicating the operational status of the first antenna and stores the database entry representing the operational status of the first antenna;*

*responsive to receiving the second antenna monitor signal, the monitoring unit generates the second antenna status indicating an operational status of the second antenna and stores the database entry representing the operational status of the second antenna;*

*responsive to failing to receive the first antenna monitor signal, the monitoring unit generates the first antenna status indicating a defective status of the first antenna and stores a database entry representing the defective status of the first antenna;*

*responsive to failing to receive the second antenna monitor signal, the monitoring unit generates the second antenna status indicating the defective status of the second antenna and stores a database entry representing the defective status of the second antenna.*

*25. The antenna monitoring system of claim 24, wherein:*

*the first monitor device is configured to transmit the first antenna monitor signal via the first antenna;*

*the second monitor device is configured to transmit the second antenna monitor signal via the second antenna; and*

*the monitoring unit receives the first antenna monitor signal from a communication path that includes the first antenna and receives the second antenna monitor signal from a communication path that includes the second antenna.*

*26. The antenna monitoring system of claim 25, wherein the first monitor device is powered by a first battery and the second monitor device is powered by a second battery.*

*27. The antenna monitoring system of claim 26, wherein the first monitor data includes data representative of a current status of power of the first battery, and wherein the second monitor data includes data representative of a current status of power of the second battery.*

*28. The antenna monitoring system of claim 25, wherein the monitoring unit is configured to measure a signal strength associated with the first antenna monitor signal and to generate an additional first antenna status indicative of the signal strength.*

*29. An antenna monitoring system comprising:*

*a first monitor device configured to be mounted on or within a housing of a first antenna, the first monitor device comprising a first local antenna, a first transceiver configured to receive and transmit signals, and a first local storage storing first monitor identification data identifying the first monitor device, the first monitor device configured to transmit, responsive to being polled by a monitoring unit, a first antenna monitor signal using the first local antenna and via the first antenna, the first antenna monitor signal including the first monitor identification data;*

*an antenna status database storing one or more antenna status entries indicating a status of the first antenna; and*

*the monitoring unit configured to receive the first antenna monitor signal transmitted by the first monitor device, determine a first antenna status based on receipt or non-receipt of the first antenna monitor signal, and*

*store in the antenna status database a first antenna status entry comprising data indicative of the first antenna status;*

*wherein the first monitor device transmits the first antenna monitor signal;*

*wherein responsive to the monitoring unit failing to receive, after a predetermined number of polls, the first antenna monitor signal, the monitoring unit determines that the first antenna status is defective and stores in the antenna status database the first antenna status entry comprising data indicating that the first antenna is defective; and*

*wherein responsive to the monitoring unit receiving, within the predetermined number of polls, the first antenna monitor signal, the monitoring unit determines that the first antenna status is normal and stores in the antenna status database the first antenna status entry comprising data indicating that the first antenna is operating normally.*

*30. The antenna monitoring system of claim 29, wherein the monitoring unit is further configured to:*

*upon receiving the first antenna monitor signal, determine a first antenna level status based on a signal strength indicated by the first antenna monitor signal; and*

*responsive to a comparison involving the signal strength indicating degradation, determine that the first antenna level status corresponds to a low level.*

*31. The antenna monitoring system of claim 30, wherein degradation is indicated when the signal strength indicated by the first antenna monitor signal is lower than a threshold strength.*

*32. The antenna monitoring system of claim 30, wherein degradation is indicated when a difference between the signal strength and a prior signal strength is greater than a threshold difference.*

*33. The antenna monitoring system of claim 30, wherein the monitoring unit is further configured to measure the signal strength of the first antenna monitor signal.*

*34. The antenna monitoring system of claim 30, wherein the first monitor device is further configured to measure signal strength of signals transmitted by the first antenna, and wherein data indicating the measured signal strength is included in the first antenna monitor signal transmitted by the first monitor device.*

*35. The antenna monitoring system of claim 30, wherein the first antenna status entry further comprises data indicative of the first antenna level status.*

*36. The antenna monitoring system of claim 29, wherein the first monitor device is powered by a battery.*

*37. The antenna monitoring system of claim 29, wherein the monitoring unit receives the first antenna monitor signal via the first antenna.*

*38. The antenna monitoring system of claim 29, wherein the antenna status database is a component of the monitoring unit.*

*39. The antenna monitoring system of claim 29, wherein the antenna status database is remote to the monitoring unit.*

*40. The antenna monitoring system of claim 39, wherein the monitoring unit stores data in the antenna status database using wireless communication.*

*41. The antenna monitoring system of claim 29, wherein the antenna status database stores information indicative of a location of the first antenna.*

*42. The antenna monitoring system of claim 29, further comprising a second monitor device configured to be mounted on or within a housing of a second antenna, the second monitor device comprising a second local antenna, a second transceiver configured to receive and transmit signals, and a second local storage storing second monitor identification data identifying the second monitor device, the second monitor device configured to transmit, responsive to being polled by a monitoring unit, a second antenna monitor signal using the second local antenna and via the second antenna, the second antenna monitor signal including the second monitor identification data,*

*wherein the one or more antenna status entries indicate a status of at least one of the first antenna or the second antenna;*

*wherein the monitoring unit is further configured to receive the second antenna monitor signal transmitted by the second monitor device, determine a second antenna status based on receipt or non-receipt of the second antenna monitor signal, and store in the antenna status database a second antenna status entry comprising data indicative of the second antenna status;*

*wherein the second monitor device transmits the second antenna monitor signal;*

*wherein responsive to the monitoring unit failing to receive, after the predetermined number of polls, the second antenna monitor signal, the monitoring unit determines that the second antenna status is defective and stores in the antenna status database the second antenna status entry comprising data indicating that the second antenna is defective; and*

*wherein responsive to the monitoring unit receiving, within the predetermined number of polls, the second antenna monitor signal, the monitoring unit determines that the second antenna status is normal and stores in the antenna status database the second antenna status entry comprising data indicating that the second antenna is operating normally.*

* * * * *